United States Patent
Suzuki

(10) Patent No.: US 10,211,731 B2
(45) Date of Patent: Feb. 19, 2019

(54) SEMICONDUCTOR DEVICE AND DISPLAY DEVICE

(71) Applicant: ROHM CO., LTD., Kyoto (JP)

(72) Inventor: Wataru Suzuki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 51 days.

(21) Appl. No.: 15/428,351

(22) Filed: Feb. 9, 2017

(65) Prior Publication Data

US 2017/0236488 A1   Aug. 17, 2017

(30) Foreign Application Priority Data

Feb. 12, 2016 (JP) ................... 2016-024960

(51) Int. Cl.
*H02M 3/157* (2006.01)
*H02M 3/158* (2006.01)

(52) U.S. Cl.
CPC ........... *H02M 3/157* (2013.01); *H02M 3/158* (2013.01)

(58) Field of Classification Search
CPC .. H02M 3/158; H02M 3/1582; H02M 3/1584; H02M 3/156; H02M 3/155; H02M 3/157; H02M 3/1563
USPC ......................................... 323/271, 282–285
See application file for complete search history.

(56) References Cited

U.S. PATENT DOCUMENTS

| 2001/0028241 | A1* | 10/2001 | Saito | ................... | B60G 17/0185 323/282 |
| 2015/0349636 | A1* | 12/2015 | Bodano | ................... | H02M 3/158 323/271 |
| 2017/0110967 | A1* | 4/2017 | Trichy | ................... | H02M 3/158 |

FOREIGN PATENT DOCUMENTS

JP   2009-265216   11/2009

* cited by examiner

*Primary Examiner* — Nguyen Tran
(74) *Attorney, Agent, or Firm* — Fish & Richardson P.C.

(57) ABSTRACT

A semiconductor device includes: a first switching power supply part including a switching element, an inductor connected to the switching element, and a pulse width modulation (PWM) driving signal generating part configured to generate a PWM driving signal having a duty controlled based on a feedback of an output voltage, wherein the switching power supply part is configured to switching-drive the switching element based on the PWM driving signal to generate the output voltage from an input voltage and supply the output voltage to a load; and an abnormality detecting part having a duty calculation part configured to calculate the duty of the PWM driving signal and a comparing part configured to compare the calculated duty and a predetermined first threshold value to output a first detection signal to indicate abnormality when the duty is lower than the first threshold value.

20 Claims, 8 Drawing Sheets

SEMICONDUCTOR DEVICE AND DISPLAY DEVICE

CROSS-REFERENCE TO RELATED APPLICATION(S)

This application is based upon and claims the benefit of priority from Japanese Patent Application No. 2016-024960, filed on Feb. 12, 2016, the entire contents of which are incorporated herein by reference.

TECHNICAL FIELD

The present disclosure relates to a semiconductor device having a switching power supply part.

BACKGROUND

Conventionally, various display devices such as a liquid crystal display (LCD) and the like have been developed. Further, a vehicle-mounted display device which is mounted on a vehicle has also been developed.

Recently, the use of a vehicle-mounted display device has extended to applications such as an instrument panel (instrument panel mounted on a dashboard) that performs liquid crystal display in full scale and a back monitor for displaying an image of a rear side of a vehicle, in addition to conventional navigation devices. Thus, the importance of information regarding a display operation when a driver drives a vehicle is on the rise.

In particular, as ISO26262 or the like, which is an international standard for functional safety regarding electricity/electronics of automobiles, has been established, the function of detecting an abnormality in display operation has become important.

Conventionally, when detecting an abnormality in display operation, an enable signal transmitted to the analog power supply circuit is merely monitored to determine whether an analog power supply circuit for driving a display panel (for example, an LCD panel) is in an enabled state.

However, in the method of monitoring the enable signal to the analog power supply circuit, when an abnormality occurs in the display operation due to driver abnormality or circuit abnormality on the display panel side in supplying power from the analog power supply circuit to a driver (load) that drives a display panel, the abnormality cannot be detected because the analog power supply circuit itself is in an enabled state.

SUMMARY

The present disclosure provides some embodiments of a semiconductor device capable of detecting the occurrence of an abnormality caused by an abnormality on a load side when a power supply circuit supplies power to the load.

According to one embodiment of the present disclosure, there is provided a first semiconductor device, including: a switching power supply part including a switching element, an inductor connected to the switching element, and a pulse width modulation (PWM) driving signal generating part configured to generate a PWM driving signal having a duty controlled based on feedback of an output voltage, wherein the switching power supply part is configured to switching-drive the switching element based on the PWM driving signal to generate the output voltage from an input voltage and supply the output voltage to a load, and is configured to operate in a continuous current mode in which a current continuously flows through the inductor and a discontinuous current mode in which a current intermittently flows through the inductor; and an abnormality detecting part having a duty calculation part configured to calculate the duty of the PWM driving signal and a comparing part configured to compare the calculated duty and a predetermined first threshold value to output a first detection signal to indicate abnormality when the duty is lower than the first threshold value (first configuration).

In the semiconductor device having the first configuration, the abnormality detecting part may further include: a first counter configured to count a first count value corresponding to a width of a high level or a low level of the PWM driving signal based on the PWM driving signal and an internal clock; and a second counter configured to count a second count value corresponding to a period of the PWM driving signal based on the PWM driving signal and the internal clock, wherein the duty calculation part may be configured to calculate the duty based on the first count value and the second count value (second configuration).

In the semiconductor device having the first or second configuration, the semiconductor device may further include a second switching power supply part having the same configuration as that of the first switching power supply part, wherein the abnormality detecting part may further include: a second duty calculation part configured to calculate a duty of a PWM driving signal of the second switching power supply part; and a second comparing part configured to compare the calculated duty of the PWM driving signal of the second switching power supply part and a predetermined second threshold value to output a second detection signal to indicate abnormality when the duty of the PWM driving signal of the second switching power supply part is lower than the second threshold value (third configuration).

In the semiconductor device having the third configuration, the abnormality detecting part may further include a determination result output part configured to output a third detection signal to indicate abnormality when at least one of the first detection signal and the second detection signal indicates abnormality (fourth configuration).

In the semiconductor device having the fourth configuration, the determination result output part may be configured to output the third detection signal to a host controller (fifth configuration).

In the semiconductor device having any one of the third to fifth configurations, the first switching power supply part may be a boost converter configured to boost the input voltage to generate a positive source voltage as the output voltage, and the second switching power supply part may be an inverting converter configured to invert a polarity of the input voltage to output a negative source voltage as the output voltage (sixth configuration).

In the semiconductor device having any one of the first to sixth configurations, the comparing part (second comparing part) may be configured to compare the calculated duty and a third threshold value higher than the first or second threshold value to output the first or second detection signal to indicate abnormality even when the duty is higher than the third threshold value (seventh configuration).

In the semiconductor device having any one of the first to seventh configurations, the comparing part (second comparing part) may be configured to output the first or second detection signal to indicate normality when the number of times the duty is lower than the first or second threshold value is less than a predetermined number of times (eighth configuration).

In the semiconductor device having any one of the first to eighth configurations, the PWM driving signal may be a gate signal applied to a gate of the switching element which is a field effect transistor (ninth configuration).

In the semiconductor device having any one of the first to ninth configurations, the semiconductor device may further include a source driver configured to drive a display panel, wherein the load may include the source driver (tenth configuration).

According to another embodiment of the present disclosure, there is provided a display device including: the semiconductor device having the tenth configuration; and a display panel driven by the semiconductor device (eleventh configuration).

The semiconductor device having the tenth configuration or the display device having the eleventh configuration may be mounted on a vehicle.

DETAILED DESCRIPTION

One embodiment of the present disclosure will now be described in detail with reference to the drawings.
<Liquid Crystal Display (LCD) Device>

Figure 1:
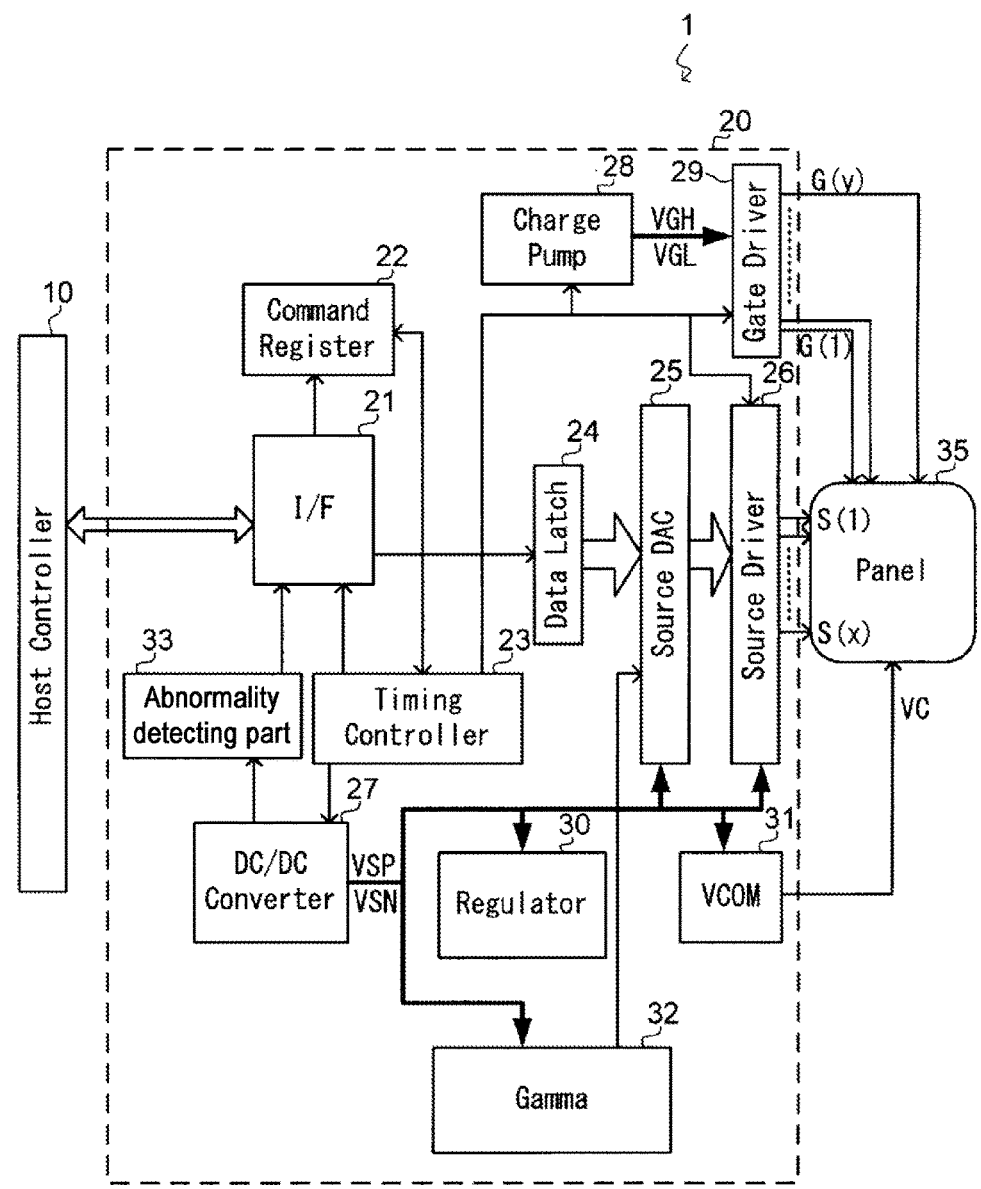
FIG. 1 is a block diagram illustrating a configuration of a liquid crystal display device according to one embodiment of the present disclosure.

FIG. 1 is a block diagram illustrating a configuration example of an LCD device. The LCD device 1 of this configuration example includes an LCD driver 20 and an LCD panel 35. The LCD driver 20 controls driving of the LCD panel 35 based on an image signal and various commands input from a host controller 10 (microcomputer or the like). The LCD panel 35 is an image output means using liquid crystal elements as pixels, and is driven as a load of the LCD driver 20.
<LCD Driver>

Next, the LCD driver 20 will be described in detail with reference to FIG. 1. The LCD driver 20 includes elements such as an interface 21, a command register 22, a timing controller 23, a data latch part 24, a source D/A converter (DAC) 25, a source driver 26, a DC/DC converter 27, a charge pump 28, a gate driver 29, a regulator 30, a common voltage generating part 31, a gamma voltage generating part 32, and an abnormality detecting part 33. The LCD driver 20 is a semiconductor device (IC) in which these elements are integrated on a single chip.

The interface 21, which exchanges data with the host controller 10, receives image data, various commands and the like from the host controller 10.

The command register 22 stores various commands transmitted from the host controller 10 via the interface 21. The timing controller 23 performs various timing controls of the LCD river 20 based on the commands stored in the command register 22. For example, the timing controller 23 performs a vertical synchronous control of the gate driver 29, a horizontal synchronous control of the source driver 26, and the like.

The charge pump 28 is a power supply circuit that generates a positive source voltage VGH and a negative source voltage VGL by a method of obtaining an output voltage by transmitting electric charges and superimposing an input voltage and a voltage charged in a capacitor.

The gate driver 29 operates by being supplied with the positive source voltage VGH and the negative source voltage VGL, and generates gate signals G(1) to G(y) of the LCD panel 35 based on a vertical synchronization signal input from the timing controller 23. When the LCD panel 35 is an active matrix type panel, the gate signals G(1) to G(y) are supplied to gate terminals of active elements respectively connected to the liquid crystal elements of the LCD panel 35.

The DC/DC converter 27 is a switching power supply circuit which includes a boost converter for boosting an input voltage to generate a positive source voltage VSP (e.g., +6 V) and an inverting converter for inverting the polarity of the input voltage to generate a negative source voltage VSN (e.g., −6 V). The positive source voltage VSP and the negative source voltage VSN are supplied to the source DAC 25, the source driver 26, the regulator 30, the common voltage generating part 31, and the gamma voltage generating part 32.

The source DAC 25 performs D/A conversion based on the image data input from the host controller 10 via the interface 21 and the data latch part 24 to generate an analog image signal, and outputs it to the source driver 26. The source driver 26 operates by being supplied with the positive source voltage VSP and the negative source voltage VSN, and converts the input analog image signal into source signals S(1) to S(x). When the LCD panel 35 is an active matrix type panel, the source signals S(1) to S(x) are supplied to source terminals of the active elements respectively connected to the liquid crystal elements of the LCD panel 35.

The common voltage generating part 31 generates a common voltage VC and supplies it to a common electrode of all the pixels constituting the LCD panel 35.

The gamma voltage generating part 32 generates a gradation voltage for correcting the brightness value of the image data received by the interface 21. The source DAC 25 performs D/A conversion on image data corrected by the gradation voltage.

The abnormality detecting part 33 is a circuit that detects an abnormality in a display operation on the LCD panel 35 by monitoring the operation of the DC/DC converter 27, details of which will be described later.
<DC/DC Converter>

Figure 2:
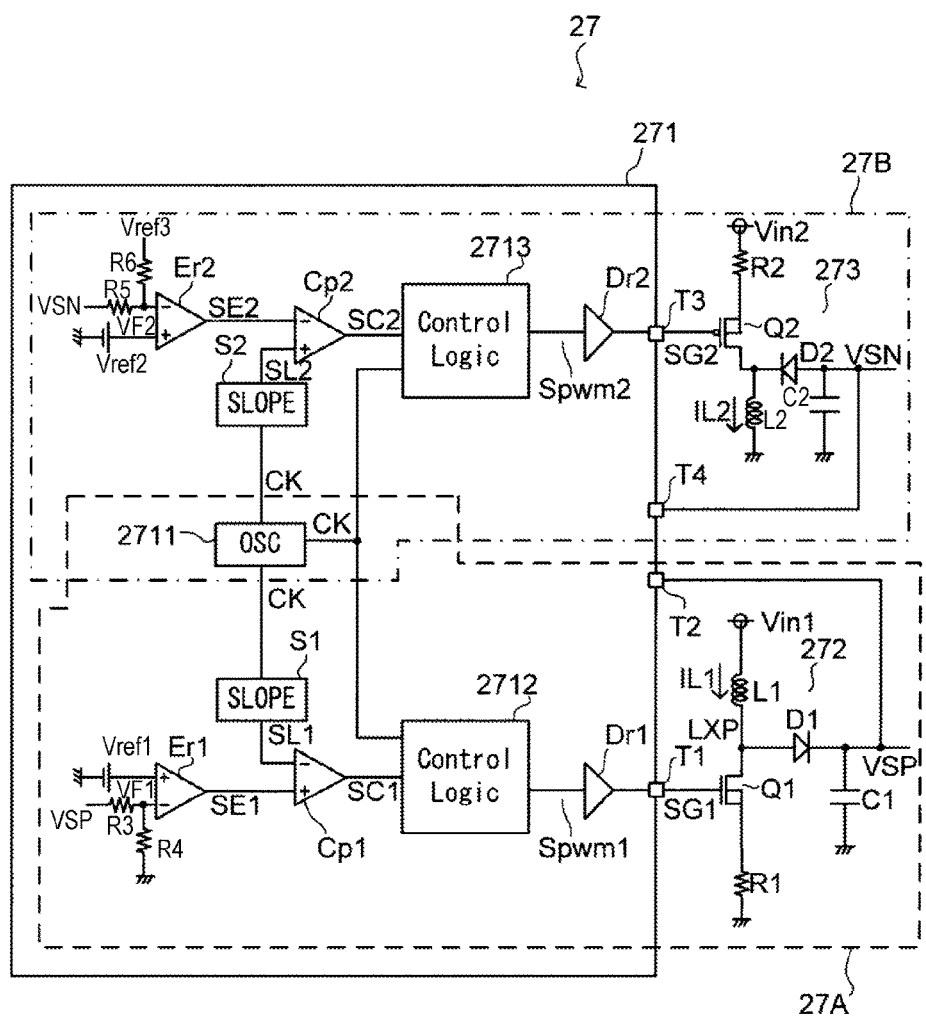
FIG. 2 is a circuit diagram illustrating a configuration of a DC/DC converter according to one embodiment of the present disclosure.

FIG. 2 is a circuit diagram illustrating a specific configuration of the DC/DC converter 27. The DC/DC converter 27 illustrated in FIG. 2 has a switching drive part 271, a first output stage 272, and a second output stage 273. The switching drive part 271 has external terminals T1 to T4.

The first output stage 272 includes a coil (inductor) L1, a switching element Q1 which is an N-channel metal-oxide semiconductor field-effect transistor (MOSFET), a resistor R1, a diode D1, and a capacitor C1. An input voltage Vin1 is applied to one end of the coil L1, and a drain of the switching element Q1 and an anode of the diode D1 are connected to the other end of the coil L1. A source of the switching element Q1 is connected to a ground terminal via the resistor R1. A cathode of the diode D1 is connected to one end of the capacitor C1. The other end of the capacitor C1 is connected to a ground terminal. The positive source voltage VSP is generated as an output voltage at a connection point between the cathode of the diode D1 and the capacitor C1.

The switching drive part 271 includes elements such as an oscillator 2711, a control logic part 2712, an error amplifier Er1, resistors R3 and R4, a slope signal generating part S1, a comparator Cp1 and a driver Dr1. A boost converter (first switching power supply part) 27A which boosts the input voltage Vin1 to generate and output the positive source voltage VSP is configured by those elements and the first output stage 272.

The oscillator 2711 generates a clock signal CK and outputs the clock signal CK to the slope signal generating part S1 and the control logic part 2712. The slope signal generating part S1 generates and outputs a slope signal SL1 of a triangular wave or a sawtooth wave based on the clock signal CK. A feedback voltage VF1 generated by dividing the positive source voltage VSP applied via the external terminal T2 by the resistors R3 and R4 is applied to an inverting terminal (−) of the error amplifier Er1. That is, a feedback voltage generating part is configured by the resistors R3 and R4. A reference voltage Vref1 is applied to a non-inverting terminal (+) of the error amplifier Er1.

The error amplifier Er1 amplifies a difference between the feedback voltage VF1 and the reference voltage Vref1 to output an error signal SE1. The error signal SE1 is applied to a non-inverting terminal (+) of the comparator Cp1, and the slope signal SL1 is applied to an inverting terminal (−) of the comparator Cp1. The comparator Cp1 compares the error signal SE1 and the slope signal SL1 to output a comparison signal SC1.

The control logic part 2712 generates a pulse-like pulse width modulation (PWM) output signal Spwm1 based on the clock signal CK and the comparison signal SC1 and outputs the same to the driver Dr1. The driver Dr1 generates a gate signal SG1 based on the PWM output signal Spwm1 and outputs the same to a gate of the switching element Q1 via the external terminal T1. The switching element Q1 is switching-driven by the gate signal SG1.

That is, if the gate signal SG1 is regarded as a PWM driving signal, a PWM driving signal generating part is configured by the error amplifier Er1, the comparator Cp1, the slope signal generating part S1, the oscillator 2711, the control logic part 2712, and the driver Dr1. Further, the PWM output signal Spwm1 may also be considered as the PWM driving signal.

An operation of the boost converter 27A having the configuration described above will be described with reference to FIGS. 3 and 4. The boost converter 27A has a continuous current mode in which a current constantly flows through the coil L1 and a discontinuous current mode in which a current intermittently flows through the coil L1.

Figure 3:
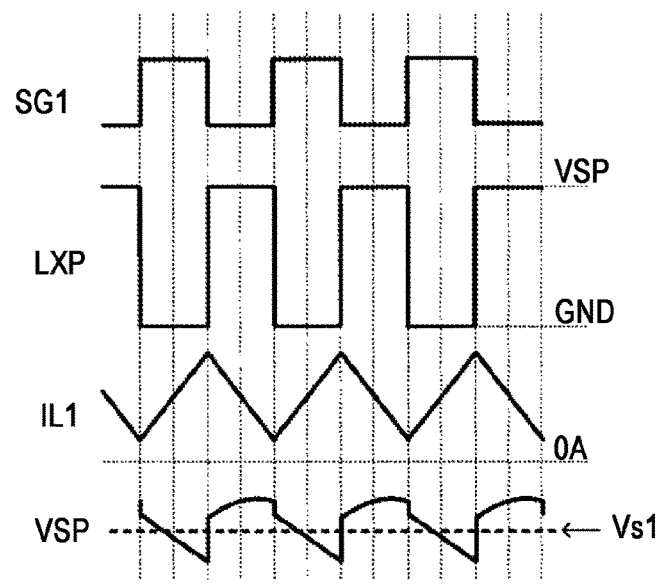
FIG. 3 is a timing chart illustrating an operational example of a boost converter in a continuous current mode.

FIG. 3 is a timing chart illustrating an operation of the boost converter 27A in the continuous current mode. When the gate signal SG1 has a high level, the switching element Q1 is turned on, a coil current IL1 flowing through the coil L1 increases, and a voltage LXP at a connection point between the coil L1 and the switching element Q1 has a ground potential. At this time, the diode D1 is turned off, the capacitor C1 discharges, and the positive source voltage VSP decreases.

When the gate signal SG1 has a low level, the switching element Q1 is turned off and the diode D1 is turned on. Accordingly, the coil current IL1 flows to the load side via the diode D1 and the current value decreases. At this time, a voltage obtained by adding a voltage generated in the coil L1 to the input voltage Vin1 is applied to and charged in the capacitor C1. Thus, the positive source voltage VSP rises.

In the continuous current mode, the positive source voltage VSP is controlled to be constant at a voltage set value Vs1 by controlling a duty of the PWM output signal Spwm1 (further, the gate signal SG1) according to the feedback voltage VF1 which is derived from the positive source voltage VSP.

Figure 4:
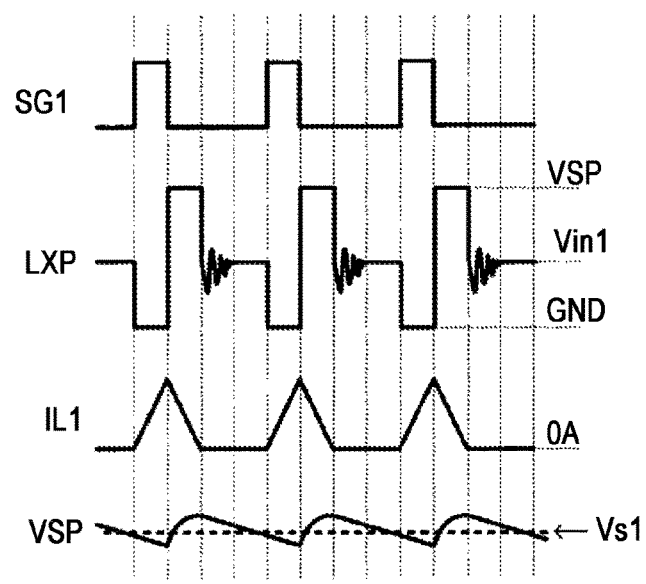
FIG. 4 is a timing chart illustrating an operational example of a boost converter in a discontinuous current mode.

FIG. 4 is a timing chart illustrating an operation of the boost converter 27A in the discontinuous current mode. When the gate signal SG1 has a high level, the switching element Q1 is turned on, the coil current IL1 flowing through the coil L1 increases, and the voltage LXP at the connection point between the coil L1 and the switching element Q1 has a ground potential. At this time, the diode D1 is turned off, the capacitor C1 discharges, and the positive source voltage VSP decreases.

When the gate signal SG1 has a low level, the switching element Q1 is turned off and the diode D1 is turned on. Accordingly, the coil current IL1 flows to the load side via the diode D1 and the current value decreases. At this time, a voltage obtained by adding a voltage generated in the coil L1 to the input voltage Vin1 is applied to and charged in the capacitor C1. Thus, the positive source voltage VSP rises. The voltage LXP becomes the positive source voltage VSP.

When the coil current IL1 decreases and reaches zero while the gate signal SG1 has a low level, the diode D1 is turned off and the voltage LXP becomes the input voltage Vin1. Since the capacitor C1 discharges, the positive source voltage VSP decreases.

In the discontinuous current mode, the positive source voltage VSP is controlled to be constant at the voltage set value Vs1 by controlling a duty of the PWM output signal Spwm1 (further, the gate signal SG1) according to the feedback voltage VF1 which is derived from the positive source voltage VSP.

In the continuous current mode, the positive source voltage VSP, which is the output voltage, is determined only by the duty and the input voltage Vin1. However, in the discontinuous current mode, in the case of the same duty as that of the continuous current mode, energy supplied to the load becomes excessive. That is, in the discontinuous current mode, in order to obtain the same output voltage as that in the continuous current mode, it is necessary to reduce the duty. In the discontinuous current mode, as the current supplied to the load decreases, the duty decreases to obtain the same output voltage.

Here, as illustrated in FIG. 1, the source DAC 25, the source driver 26, the regulator 30, the common voltage generating part 31, and the gamma voltage generating part 32 are present as the load of the boost converter 27A, but during the display operation of the LCD panel 35, the source driver 26 among them has the largest current consumption. If the display operation is normal, since the current consumption in the load becomes relatively large, the boost converter 27A operates in the continuous current mode.

However, when the display operation is abnormal due to abnormality of the source driver 26, circuit abnormality on the LCD panel 35 side, wiring abnormality, mounting abnormality of the LCD driver 20 or the like, the current consumption in the source driver 26 becomes certainly smaller. Thus, the boost converter 27A enters the discontinuous current mode, and the duty of the PWM output signal Spwm1 (further, the gate signal SG1) is controlled to be small by feedback control based on the feedback voltage VF1 in order to obtain the same output voltage as that in the continuous current mode. Therefore, by comparing the duty of the gate signal SG1 (or the PWM output signal Spwm1) with a predetermined threshold value, it is possible to detect an abnormality in the display operation caused by the abnormality on the load side as described above.

In addition, an inverting converter (second switching power supply part) 27B which inverts the polarity of an input voltage Vin2 to output the negative source voltage VSN as the output voltage is configured by elements such as the oscillator 2711, a slope signal generating part S2, an error amplifier Er2, resistors R5 and R6, a comparator Cp2, a control logic part 2713, and a driver Dr2, which are included in the switching drive part 271, and the second output stage 273.

The input voltage Vin2 is applied to one end of a resistor R2, and the other end of the resistor R2 is connected to a source of a switching element Q2 which is a P-channel MOSFET. A drain of the switching element Q2 is connected to one end of a coil (inductor) L2 and a cathode of a diode D2. The other end of the coil L2 is connected to a ground terminal. An anode of the diode D2 is connected to one end of a capacitor C2. The other end of the capacitor C2 is connected to a ground terminal. The negative source voltage VSN is generated as the output voltage at a connection point between the anode of the diode D2 and the capacitor C2.

The oscillator 2711 generates the clock signal CK and outputs the clock signal CK to the slope signal generating part S2 and the control logic part 2713. The slope signal generating part S2 generates and outputs a slope signal SL2 of a triangular wave or a sawtooth wave based on the clock signal CK. A feedback voltage VF2 generated by dividing a voltage between the negative source voltage VSN applied via the external terminal T4 and a reference voltage Vref3 by the resistors R5 and R6 is applied to an inverting terminal (−) of the error amplifier Er2. That is, a feedback voltage generating part is configured by the resistors R5 and R6. A reference voltage Vref2 is applied to a non-inverting terminal (+) of the error amplifier Er2.

The error amplifier Er2 amplifies a difference between the feedback voltage VF2 and the reference voltage Vref2 to output an error signal SE2. The error signal SE2 is applied to an inverting terminal (−) of the comparator Cp2, and the slope signal SL2 is applied to a non-inverting terminal (+) of the comparator Cp2. The comparator Cp2 compares the error signal SE2 and the slope signal SL2 to output a comparison signal SC2.

The control logic part 2713 generates a pulse-like PWM output signal Spwm2 based on the clock signal CK and the comparison signal SC2 and outputs the same to the driver Dr2. The driver Dr2 generates a gate signal SG2 based on the PWM output signal Spwm2 and outputs the same to a gate of the switching element Q2 via the external terminal T3. The switching element Q2 is switching-driven by the gate signal SG2.

That is, if the gate signal SG2 is regarded as a PWM driving signal, a PWM driving signal generating part is configured by the error amplifier Er2, the comparator Cp2, the slope signal generating part S2, the oscillator 2711, the control logic part 2713, and the driver Dr2. Further, the PWM output signal Spwm2 may also be considered as the PWM driving signal.

An operation of the inverting converter 27B having the configuration described above will be described. When the gate signal SG2 has a low level, the switching element Q2 is turned on and a coil current IL2 flowing through the coil L2 increases. At this time, the diode D2 is turned off. Further, when the gate signal SG2 has a high level, the switching element Q2 is turned off and the coil current IL2 flows through the diode D2 which is turned on. Due to the direction of the coil current IL2, the negative source voltage VSN having the opposite polarity of the input voltage Vin2 is generated at the connection point between the anode of the diode D2 and the capacitor C2. A portion of the coil current IL2 is used for charging the capacitor C2.

Similar to the boost converter 27A, the inverting converter 27B has a continuous current mode in which the coil current IL2 continuously flows and a discontinuous current mode in which the coil current IL2 intermittently flows. In the discontinuous current mode, it is necessary to set the duty of the PWM output signal Spwm2 (further, the gate signal SG2) smaller than that in the continuous current mode in order to obtain the same output voltage (negative source voltage VSN) as that in the continuous current mode.

When an abnormality occurs in the display operation due to the abnormality of the source driver 26 or the like as described above, since the current consumption in the source driver 26 becomes certainly smaller, the inverting converter 27B enters the discontinuous current mode. At this time, the duty of the PWM output signal Spwm2 (further, the gate signal SG2) is controlled to be small by feedback control based on the feedback voltage VF2 in order to obtain the same output voltage as that in the continuous current mode. Thus, by comparing the duty of the gate signal SG2 (or the PWM output signal Spwm2) with a predetermined threshold value, it is possible to detect an abnormality in the display operation caused by the abnormality on the load side as described above.

<Abnormality Detecting Part>

Figure 5:
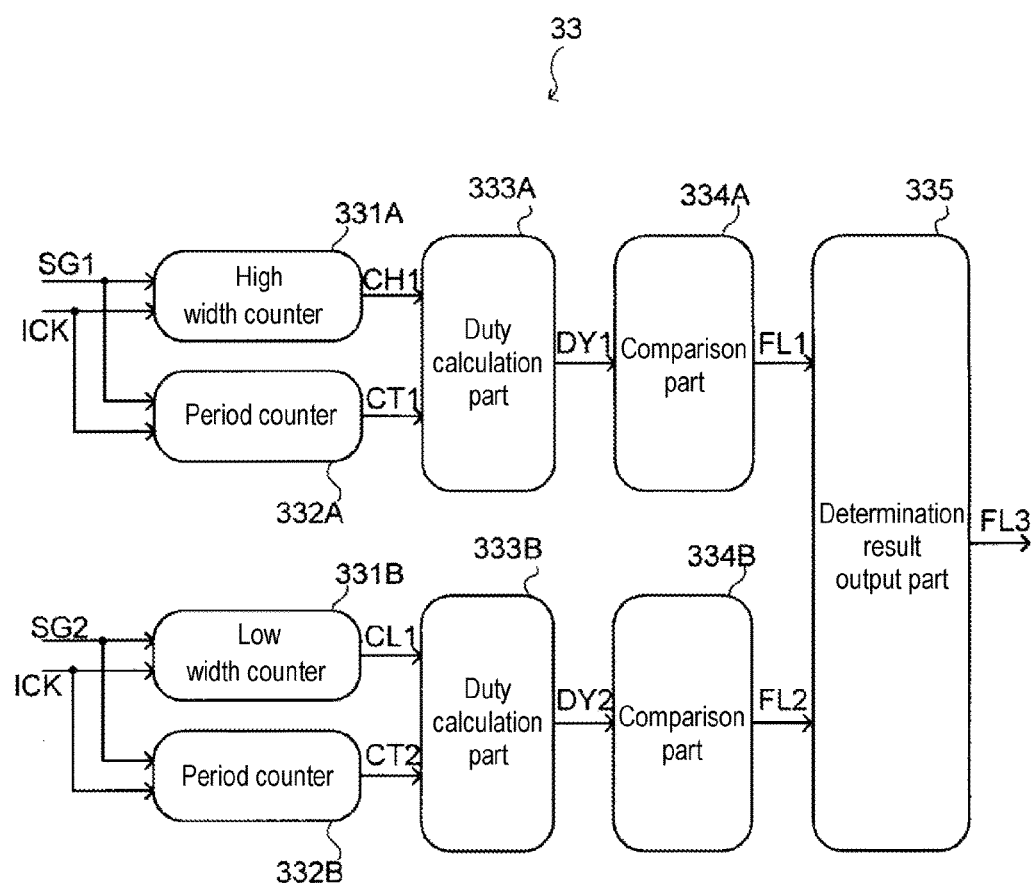
FIG. 5 is a block diagram illustrating a configuration of an abnormality detecting part according to one embodiment of the present disclosure.

Next, the abnormality detecting part 33 will be described with reference to FIGS. 5 to 8. FIG. 5 is a block diagram illustrating a specific configuration of the abnormality detecting part 33. The abnormality detecting part 33 has a high width counter 331A, a period counter 332A, a duty calculation part 333A, a comparing part 334A, a low width counter 331B, a period counter 332B, a duty calculation part 333B, a comparing part 334B, and a determination result output part 335.

Figure 7:
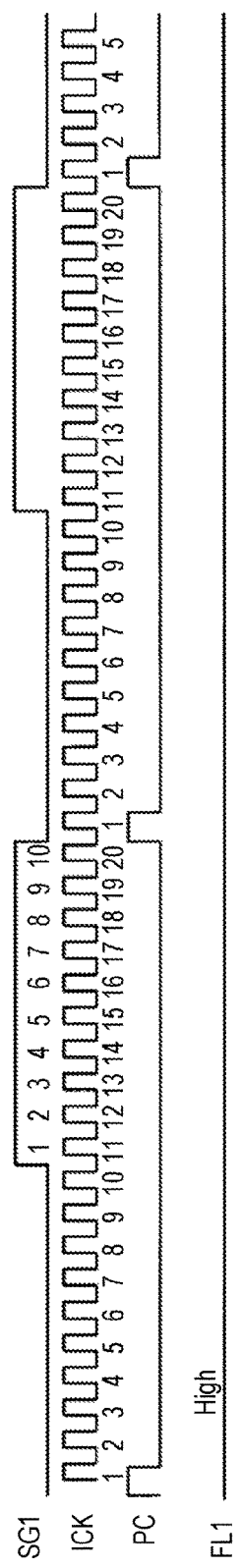
FIG. 7 is a timing chart illustrating an example of counting process by the abnormality detecting part.

The high width counter 331A counts a count value CH1 corresponding to a width of a high level of the gate signal SG1 based on the input gate signal SG1 and an internal clock ICK. For example, referring to the timing chart illustrated in FIG. 7, when the gate signal SG1 falls to a low level, the high width counter 331A generates a periodic count start pulse PC and initializes the count value CH1. Further, during a period where the gate signal SG1 has a high level, the high width counter 331A counts up the count value CH1 at every pulse of the internal clock ICK. In the example of FIG. 7, the count value CH1 corresponding to a high level width is 10.

The period counter 332A counts a count value CT1 corresponding to a period of the gate signal SG1 based on the input gate signal SG1 and the internal clock ICK. For example, referring to the timing chart illustrated in FIG. 7, when the gate signal SG1 falls to a low level, the period counter 332A generates a periodic start pulse PC and initializes the count value CT1. Further, the period counter 332A counts up the count value CT1 at every pulse of the internal clock ICK, and the count value CT1 is initialized when a next periodic start pulse PC is generated. In the example of FIG. 7, the count value CT1 corresponding to a period is 20.

The duty calculation part 333A calculates a duty DY1 of the gate signal SG1 by dividing the input count value CH1 by the input count value CT1. For example, in the example of FIG. 7, the duty DY1 is calculated as 50% by dividing the count value CH1 as 10 by the count value CT1 as 20.

The comparing part 334A compares the input duty DY1 with a predetermined threshold value to output a detection flag FL1 indicating normality or abnormality. An operation of the comparing part 334A will be described using the flowchart illustrated in FIG. 6. When the flowchart of FIG. 6 starts, first, the comparing part 334A initializes a count value N to zero at step S1. Next, at step S2, the comparing part 334A obtains the duty DY1 from the duty calculation part 333A.

Thereafter, at step S3, the comparing part 334A checks whether the duty DY1 is lower than a predetermined lower limit threshold value Duty_Min. If the duty DY1 is lower than the predetermined lower limit threshold value Duty_Min (Y at step S3), it is presumed that an abnormality in the display operation occurs due to the abnormality of the source driver 26 or the like as mentioned above. Thus, the process proceeds to step S6 to count up the count value N.

If the duty DY1 is not lower than the lower limit threshold value Duty_Min at step S3 (N at step S3), the process proceeds to step 4 wherein the comparing part 334A checks whether the duty DY1 is higher than a predetermined upper limit threshold value Duty_Max (>the lower limit threshold value Duty_Min). If the duty DY1 is higher than the predetermined upper limit threshold value (Y at step S4), it is presumed that the current consumption of the load is excessive due to abnormality of the source driver 26, circuit abnormality on the LCD panel 35 side or the like. Thus, the process proceeds to step S6 to count up the count value N.

If the duty DY1 is not higher than the upper limit threshold value Duty_Max at step S4 (N at step S4), the process proceeds to step S5 to output the detection flag FL1 indicating normality, and returns to step S1.

Further, after step S6, the comparing part 334A checks whether the count value N is 2 or more at step S7. If the count value N is not 2 or more (N at step S7), the process proceeds to step S8 to output the detection flag FL1 indicating normality is output, and returns to step S2.

Meanwhile, when the count value N is 2 or more at step S7 (Y at step S7), the process proceeds to step S9 wherein the comparing part 334A outputs the detection flag FL1 indicating abnormality, and returns to step S2.

Here, for example, it is assumed that the upper limit threshold value Duty_Max is 70% and the lower limit threshold value Duty_Min is 30%. In the example of FIG. 7, when the count value CH1 as 10 corresponding to the high level width of the gate signal SG1 is counted, the duty DY1 is calculated as 50%. Since the duty DY1 is more than 30% and less than 70%, the detection flag FL1 indicating normality is output at step S5.

Figure 8:
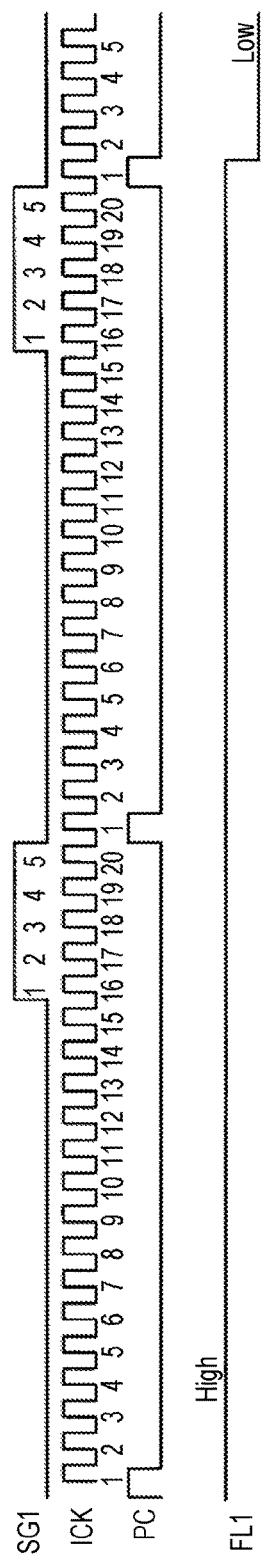
FIG. 8 is a timing chart illustrating an example of counting process by the abnormality detecting part.

Further, the example of the timing chart illustrated in FIG. 8 will be described. The count value CH1 corresponding to the high level width of the gate signal SG1 is counted as 5 in FIG. 8. Since the count value CT1 corresponding to the period is 20, the duty DY1 is calculated as 25%. Since the duty DY1 in one period on the left of FIG. 8 is 25%, the duty DY1 is lower than the lower limit threshold value Duty_Min and the count value N is counted up to 1 from zero at step S6. However, since the count value N does not reach 2 at step S7, the detection flat FL1 indicating normality is first output at step S8.

Thereafter, since the duty DY1 in one period on the right of FIG. 8 is again 25%, the count value N is further counted up and reaches 2 at step S6. Accordingly, the process proceeds to step S9 to output the detection flag FL1 indicating abnormality. In this manner, the detection flag FL1 indicating normality may be output by determination of step S7, even when the calculation value of the duty DY1 is abnormal due to noise or the like although the display operation is actually normal.

In FIGS. 7 and 8, the detection flag FL1 has a high level in the case of indicating normality, and has a low level in the case of indicating abnormality. For example, when power is not supplied to the abnormality detecting part 33 due to an abnormality, it is suitable that the detection flag FL1 has a low level indicating abnormality.

The value compared with the count value at step S7 may not necessarily be 2 but 3 or more.

The low width counter 331B counts a count value CL1 corresponding to a width of a low level of the gate signal SG2 based on the input gate signal SG2 and the internal clock ICK. The period counter 332B counts a count value CT2 corresponding to a period of the gate signal SG2 based on the input gate signal SG2 and the internal clock ICK. The duty calculation part 333B calculates a duty DY2 of the gate signal SG2 by dividing the input count value CL1 by the input count value CT2. The comparing part 334B compares the input duty DY2 with a predetermined threshold value to output a detection flag FL2 indicating normality or abnormality.

Figure 6:
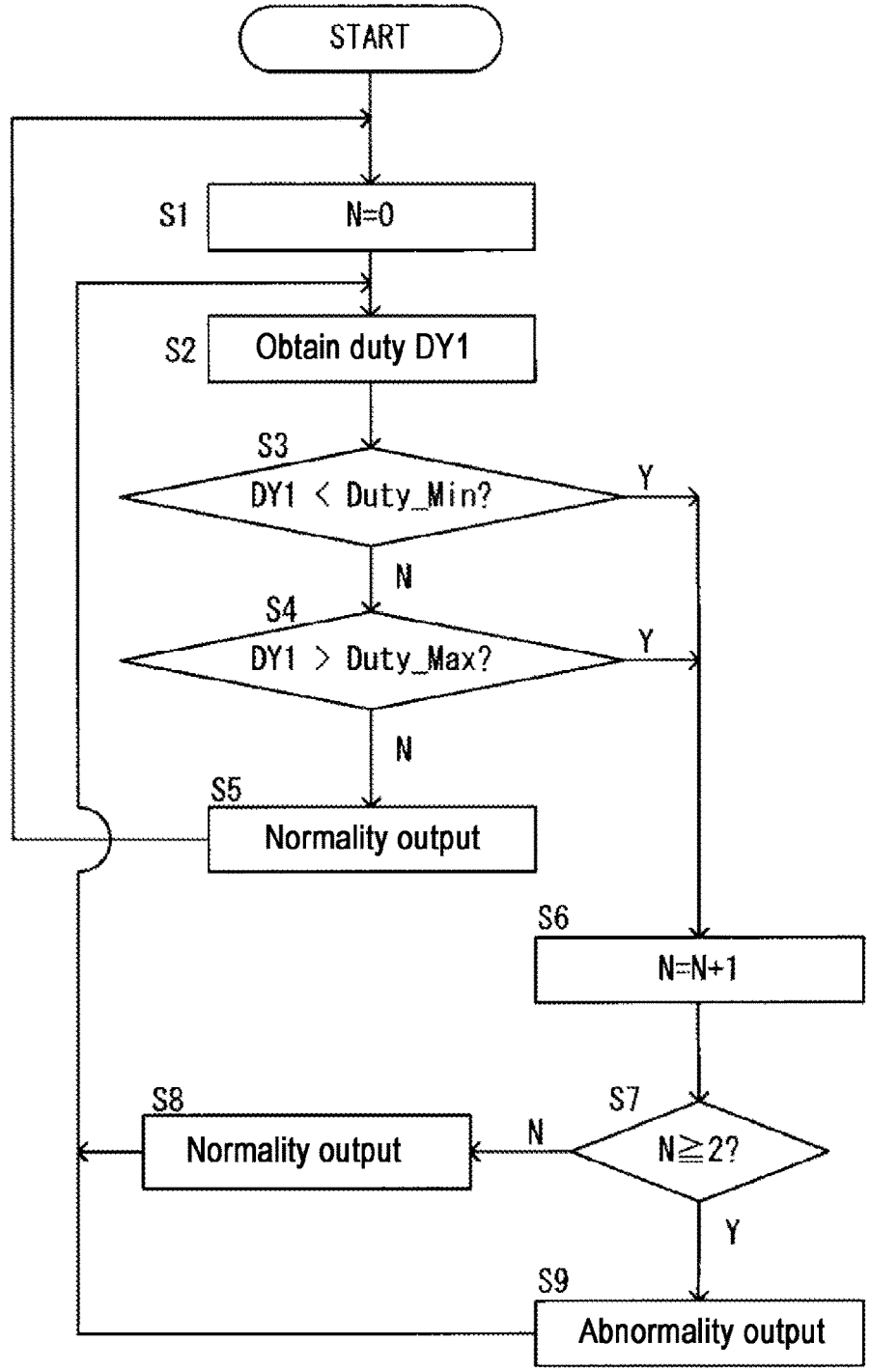
FIG. 6 is a flowchart illustrating a process of a comparing part included in the abnormality detecting part.

An operation of the comparing part 334B is similar to the flowchart illustrated in FIG. 6 described above, and thus, a detailed description thereof will be omitted. That is, when the duty DY2 is outside the range limited by the upper limit threshold value Duty_Max and the lower limit threshold value Duty_Min, the detection flat FL2 indicating abnormality is output.

When at least one of the detection flag FL1 input from the comparing part 334A and the detection flag FL2 input from the comparing part 334B indicates abnormality, the determination result output part 335 outputs a detection flag FL3 indicating abnormality. When the detection flag FL3 indicates abnormality, it may have a low level in some embodiments. The detection flag FL3 is transmitted to the host controller 10 via the interface 21 (FIG. 1).

In this manner, the abnormality detection unit 33 can detect an abnormality in the display operation caused by an abnormality on the load side of the DC/DC converter 27, and inform the host controller 10 of the detection result.

Also, instead of the gate signals SG 1 and SG 2, the PWM output signals Spwm1 and Spwm2 may be input to the high width counter 331A and the low width counter 331B, respectively.

Further, the abnormality detecting part 33 may include only one of a system of the comparing part 334A and a system of the comparing part 334B. In this case, the determination result output part 335 is not necessary. Moreover, the comparing parts 334A and 334B may respectively output the detection flags FL1 and FL2 to the host controller 10, without the determination result output part 335.

<Regarding Vehicle-Mounted Display>

Figure 9:
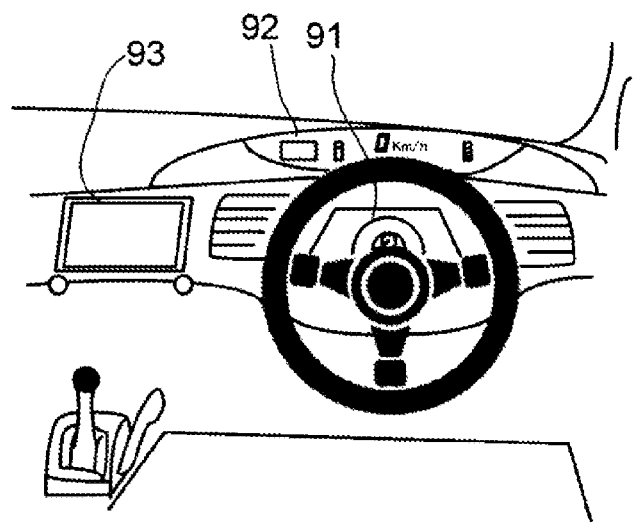
FIG. 9 is an external view illustrating an example of vehicle-mounted display.

The LCD device according to the embodiment of the present disclosure as described above is suitably applied to, particularly, a vehicle-mounted display. The vehicle-mounted display is installed in a dashboard on a front side of a driver's seat in a vehicle, for example, as in vehicle-mounted displays 91 to 93 illustrated in FIG. 9. The vehicle-mounted display 91 functions as an instrument panel that displays a speedometer, a tachometer, and the like. The vehicle-mounted display 92 displays a fuel gauge, a fuelometer, a shift position, and the like. The vehicle-mounted display 93 has a navigation function of displaying current location information of a vehicle, information of a route to a destination and the like, and also has a back monitoring function of displaying a captured image of a rear side of a vehicle.

<Other Modifications>

The embodiments described above are illustrative in all respects and should not be understood to be limiting. The technical scope of the present disclosure is presented by the accompanying claims, rather than the description of the aforementioned embodiments, and thus intended to include all modifications that fall within the meaning and scope of the accompanying claims and their equivalents.

The present disclosure can be suitably used for, for example, a vehicle-mounted LCD driver.

According to some embodiments of the present disclosure, it is possible to detect the occurrence of an abnormality caused by an abnormality on a load side when a power supply circuit supplies power to the load.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
    a first switching power supply part including a switching element, an inductor connected to the switching element, and a pulse width modulation (PWM) driving signal generating part configured to generate a PWM driving signal having a duty controlled based on a feedback of an output voltage, wherein the first switching power supply part is configured to switching-drive the switching element based on the PWM driving signal to generate the output voltage from an input voltage and supply the output voltage to a load, and is configured to operate in a continuous current mode in which a current continuously flows through the inductor and a discontinuous current mode in which a current intermittently flows through the inductor; and
    an abnormality detecting part having a duty calculation part configured to calculate the duty of the PWM driving signal and a comparing part configured to compare the calculated duty and a predetermined first threshold value to output a first detection signal to indicate abnormality when the duty is lower than the first threshold value,
    wherein the abnormality detecting part further comprises:
        a first counter configured to count a first count value corresponding to a width of a high level or a low level of the PWM driving signal based on the PWM driving signal and an internal clock; and
        a second counter configured to count a second count value corresponding to a period of the PWM driving signal based on the PWM driving signal and the internal clock, and
    wherein the duty calculation part is configured to calculate the duty based on the first count value and the second count value.

2. The semiconductor device of claim 1, further comprising a second switching power supply part having the same configuration as that of the first switching power supply part,
    wherein the abnormality detecting part further comprises:
        a second duty calculation part configured to calculate a duty of a PWM driving signal of the second switching power supply part; and
        a second comparing part configured to compare the calculated duty of the PWM driving signal of the second switching power supply part and a predetermined second threshold value to output a second detection signal to indicate abnormality when the duty of the PWM driving signal of the second switching power supply part is lower than the second threshold value.

3. The semiconductor device of claim 2, wherein the abnormality detecting part further comprises a determination result output part configured to output a third detection signal to indicate abnormality when at least one of the first detection signal and the second detection signal indicates abnormality.

4. The semiconductor device of claim 3, wherein the determination result output part is configured to output the third detection signal to a host controller.

5. The semiconductor device of claim 2, wherein the first switching power supply part is a boost converter configured to boost the input voltage to generate a positive source voltage as the output voltage, and the second switching power supply part is an inverting converter configured to invert a polarity of the input voltage to output a negative source voltage as the output voltage.

6. The semiconductor device of claim 1, wherein the comparing part is configured to compare the calculated duty and a third threshold value higher than the first threshold value to output the first detection signal to indicate abnormality even when the duty is higher than the third threshold value.

7. The semiconductor device of claim 1, wherein the comparing part is configured to output the first detection signal to indicate normality when the number of times the duty is lower than the first threshold value is less than a predetermined number of times.

8. The semiconductor device of claim 1, wherein the PWM driving signal is a gate signal applied to a gate of the switching element which is a field effect transistor.

9. The semiconductor device of claim 1, further comprising a source driver configured to drive a display panel, wherein the load includes the source driver.

10. A display device, comprising:
    the semiconductor device of claim 9; and
    a display panel driven by the semiconductor device.

11. The semiconductor device of claim 9, wherein the semiconductor device is mounted on a vehicle.

12. The display device of claim 10, wherein the display device is mounted on a vehicle.

13. A semiconductor device, comprising:
    a first switching power supply part including a switching element, an inductor connected to the switching element, and a pulse width modulation (PWM) driving signal generating part configured to generate a PWM driving signal having a duty controlled based on a feedback of an output voltage, wherein the first switching power supply part is configured to switching-drive the switching element based on the PWM driving signal to generate the output voltage from an input voltage and supply the output voltage to a load, and is configured to operate in a continuous current mode in which a current continuously flows through the inductor and a discontinuous current mode in which a current intermittently flows through the inductor;

an abnormality detecting part having a duty calculation part configured to calculate the duty of the PWM driving signal and a comparing part configured to compare the calculated duty and a predetermined first threshold value to output a first detection signal to indicate abnormality when the duty is lower than the first threshold value; and a second switching power supply part having the same configuration as that of the first switching power supply part, wherein the abnormality detecting part further comprises:
a second duty calculation part configured to calculate a duty of a PWM driving signal of the second switching power supply part; and
a second comparing part configured to compare the calculated duty of the PWM driving signal of the second switching power supply part and a predetermined second threshold value to output a second detection signal to indicate abnormality when the duty of the PWM driving signal of the second switching power supply part is lower than the second threshold value.

14. The semiconductor device of claim 13, wherein the abnormality detecting part further comprises a determination result output part configured to output a third detection signal to indicate abnormality when at least one of the first detection signal and the second detection signal indicates abnormality.

15. The semiconductor device of claim 14, wherein the determination result output part is configured to output the third detection signal to a host controller.

16. The semiconductor device of claim 13, wherein the first switching power supply part is a boost converter configured to boost the input voltage to generate a positive source voltage as the output voltage, and the second switching power supply part is an inverting converter configured to invert a polarity of the input voltage to output a negative source voltage as the output voltage.

17. The semiconductor device of claim 13, wherein the comparing part is configured to compare the calculated duty and a third threshold value higher than the first threshold value to output the first detection signal to indicate abnormality even when the duty is higher than the third threshold value.

18. The semiconductor device of claim 13, wherein the comparing part is configured to output the first detection signal to indicate normality when the number of times the duty is lower than the first threshold value is less than a predetermined number of times.

19. The semiconductor device of claim 13, wherein the PWM driving signal is a gate signal applied to a gate of the switching element which is a field effect transistor.

20. The semiconductor device of claim 13, further comprising a source driver configured to drive a display panel, wherein the load includes the source driver.

* * * * *